United States Patent
Yeh et al.

(10) Patent No.: US 9,385,110 B2
(45) Date of Patent: Jul. 5, 2016

(54) SEMICONDUCTOR DEVICE AND METHOD

(71) Applicant: Taiwan Semiconductor Manufacturing Company, Ltd., Hsin-Chu (TW)

(72) Inventors: Chao-Yang Yeh, Luzhou (TW); Ming-Tsun Lin, Taichung (TW); Hau Tao, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/463,288

(22) Filed: Aug. 19, 2014

(65) Prior Publication Data

US 2015/0371951 A1 Dec. 24, 2015

Related U.S. Application Data

(60) Provisional application No. 62/014,002, filed on Jun. 18, 2014.

(51) Int. Cl.
| | |
|---|---|
| *H01L 23/48* | (2006.01) |
| *H01L 25/16* | (2006.01) |
| *H01L 25/00* | (2006.01) |
| *H01L 21/768* | (2006.01) |
| *H01L 25/065* | (2006.01) |
| *H01L 23/538* | (2006.01) |
| *H01L 23/31* | (2006.01) |

(52) U.S. Cl.
CPC .............. *H01L 25/16* (2013.01); *H01L 21/768* (2013.01); *H01L 23/3128* (2013.01); *H01L 23/481* (2013.01); *H01L 23/5384* (2013.01); *H01L 23/5389* (2013.01); *H01L 25/0655* (2013.01); *H01L 25/50* (2013.01); *H01L 2224/18* (2013.01)

(58) Field of Classification Search
CPC .............. H01L 23/42; H01L 23/52; H01L 2924/01079; H01L 2924/01078; H01L 2924/01029; H01L 23/5226; H01L 23/481
USPC .......................................... 257/774, 778, 782
See application file for complete search history.

(56) References Cited

U.S. PATENT DOCUMENTS

| | | | |
|---|---|---|---|
| 2013/0264684 A1* | 10/2013 | Yu | H01L 21/561 257/616 |
| 2013/0329373 A1* | 12/2013 | Smith | H01L 23/13 361/728 |
| 2014/0001645 A1 | 1/2014 | Lin et al. | |
| 2014/0103488 A1 | 4/2014 | Chen et al. | |
| 2014/0299999 A1* | 10/2014 | Hu | H01L 21/56 257/774 |
| 2015/0084210 A1* | 3/2015 | Chiu | H01L 24/82 257/778 |
| 2015/0171015 A1* | 6/2015 | Mahajan | H01L 23/5381 257/712 |
| 2015/0228556 A1* | 8/2015 | Lee | H01L 23/481 257/774 |

FOREIGN PATENT DOCUMENTS

KR 20140001085 A 1/2014

* cited by examiner

*Primary Examiner* — Phuc Dang
(74) *Attorney, Agent, or Firm* — Slater & Matsil, LLP

(57) ABSTRACT

A link device with a large density routing is attached to a package in order to provide a high-density interconnect pathway to interconnect semiconductor devices. In an embodiment the package is an integrated fan out package. The link device may be bonded on either side of the package, and the package may optionally comprise through package vias. The link device may also be an integrated passive device that includes resistors, inductor, and capacitor components.

20 Claims, 6 Drawing Sheets

SEMICONDUCTOR DEVICE AND METHOD

This application claims priority to U.S. Provisional Patent Application Ser. No. 62/014,002, entitled "Semiconductor Device and Method," filed on Jun. 18, 2014, which application is hereby incorporated herein by reference.

BACKGROUND

Since the invention of the integrated circuit (IC), the semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area.

These integration improvements are essentially two-dimensional (2D) in nature, in that the volume occupied by the integrated components is essentially on the surface of the semiconductor wafer. Although dramatic improvement in lithography has resulted in considerable improvement in 2D IC formation, there are physical limits to the density that can be achieved in two dimensions. One of these limits is the minimum size needed to make these components. Also, when more devices are put into one chip, more complex designs are utilized.

In an attempt to further increase circuit density, three-dimensional (3D) ICs have been investigated. In a typical formation process of a 3D IC, two dies are bonded together and electrical connections are formed between each die and contact pads on a substrate. For example, one attempt involved bonding two dies on top of each other. The stacked dies were then bonded to a carrier substrate and wire bonds electrically coupled contact pads on each die to contact pads on the carrier substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
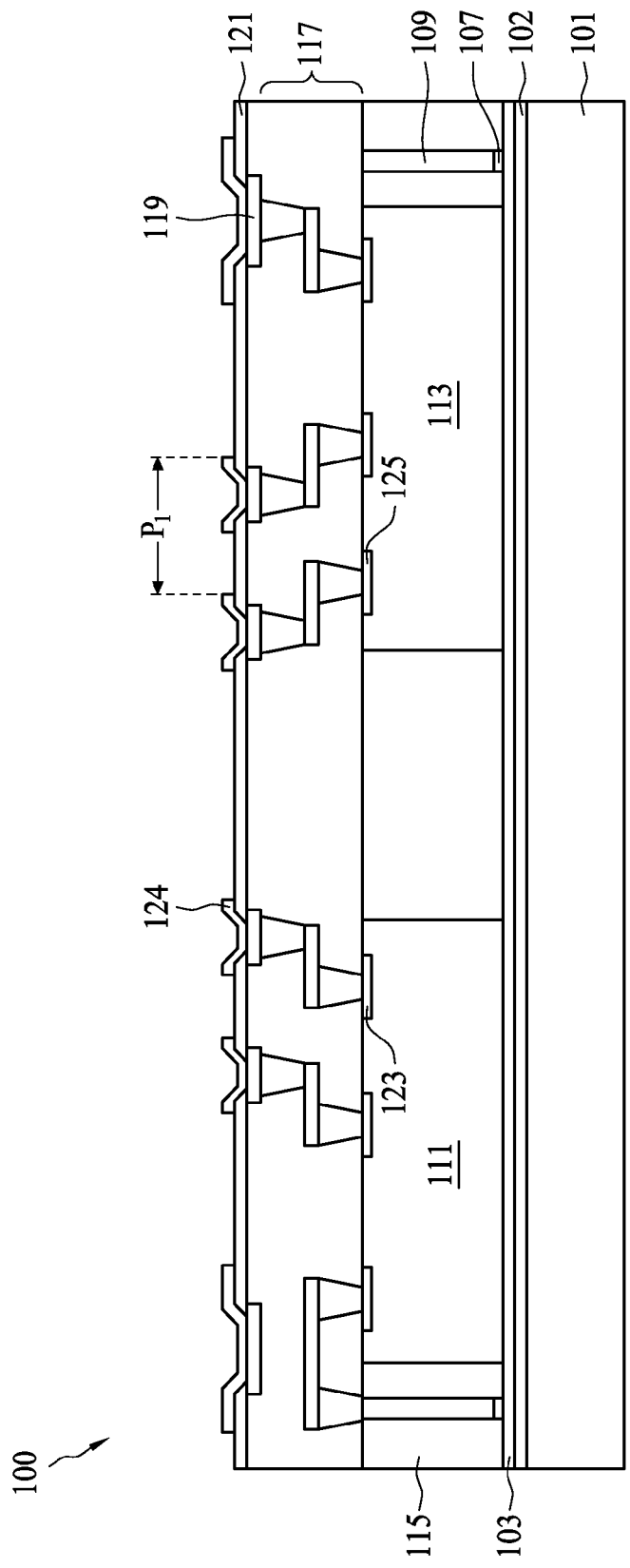
FIG. 1 illustrates an integrated fan out package in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Looking now at the figures, there is illustrated embodiments used to provide a high-density interconnect structure for an integrated fan-out (InFO) package. However, embodiments may be used in other packages as well.

FIG. 1 illustrates an intermediate product in a process of forming, e.g., a first package 100, such as an integrated fan out (InFO) package. As illustrated in FIG. 1, the intermediate structure comprises a carrier substrate 101, an adhesive layer 102, a polymer layer 103, a seed layer 107, vias 109, a first semiconductor device 111, a second semiconductor device 113, a first encapsulant 115, a first interconnection layer 117, first contact pads 119, a first passivation layer 121, and UBMs 124. The carrier substrate 101 comprises, for example, silicon based materials, such as glass or silicon oxide, or other materials, such as aluminum oxide, combinations of any of these materials, or the like. The carrier substrate 101 is planar in order to accommodate an attachment of semiconductor devices such as the first semiconductor device 111 and the second semiconductor device 113.

The adhesive layer 102 is placed on the carrier substrate 101 in order to assist in the adherence of overlying structures (e.g., the polymer layer 103). In an embodiment the adhesive layer 102 may comprise an ultra-violet glue, which loses its adhesive properties when exposed to ultra-violet light. However, other types of adhesives, such as pressure sensitive adhesives, radiation curable adhesives, epoxies, combinations of these, or the like, may also be used. The adhesive layer 102 may be placed onto the carrier substrate 101 in a semi-liquid or gel form, which is readily deformable under pressure.

The polymer layer 103 is placed over the adhesive layer 102 and is utilized in order to provide protection to, e.g., the first semiconductor device 111 and the second semiconductor device 113 once the first semiconductor device 111 and the second semiconductor device 113 have been attached. In an embodiment the polymer layer 103 may be polybenzoxazole (PBO), although any suitable material, such as polyimide or a polyimide derivative, may alternatively be utilized. The polymer layer 103 may be placed using, e.g., a spin-coating process to a thickness of between about 2 μm and about 15 μm, such as about 5 μm, although any suitable method and thickness may alternatively be used.

The seed layer 107 is a thin layer of a conductive material that aids in the formation of a thicker layer during subsequent processing steps. The seed layer 107 may comprise a layer of titanium about 1,000 Å thick followed by a layer of copper about 5,000 Å thick. The seed layer 107 may be created using processes such as sputtering, evaporation, or PECVD processes, depending upon the desired materials. The seed layer 107 may be formed to have a thickness of between about 0.3 μm and about 1 μm, such as about 0.5 μm.

Once the seed layer 107 has been formed, a first photoresist (not illustrated in FIG. 1) may be placed and patterned over the seed layer 107. In an embodiment the first photoresist may be placed on the seed layer 107 using, e.g., a spin coating technique to a height of between about 50 μm and about 250 μm, such as about 120 μm. Once in place, the first photoresist may then be patterned by exposing the first photoresist to a patterned energy source (e.g., a patterned light source) so as to induce a chemical reaction, thereby inducing a physical change in those portions of the first photoresist exposed to the patterned light source. A developer is then applied to the exposed first photoresist to take advantage of the physical changes and selectively remove either the exposed portion of the first photoresist or the unexposed portion of the first photoresist, depending upon the desired pattern.

In an embodiment the pattern formed into the first photoresist is a pattern for the vias 109. The vias 109 are formed in such a placement as to be located on different sides of subsequently attached devices such as the first semiconductor device 111 and the second semiconductor device 113. However, any suitable arrangement for the pattern of vias 109 may alternatively be utilized.

Once the first photoresist has been patterned, the vias 109 are formed within the first photoresist. In an embodiment the vias 109 comprise one or more conductive materials, such as copper, tungsten, other conductive metals, or the like, and may be formed, for example, by electroplating, electroless plating, or the like. In an embodiment, an electroplating process is used wherein the seed layer 107 and the first photoresist are submerged or immersed in an electroplating solution. The seed layer 107 surface is electrically connected to the negative side of an external DC power supply such that the seed layer 107 functions as the cathode in the electroplating process. A solid conductive anode, such as a copper anode, is also immersed in the solution and is attached to the positive side of the power supply. The atoms from the anode are dissolved into the solution, from which the cathode, e.g., the seed layer 107, acquires the dissolved atoms, thereby plating the exposed conductive areas of the seed layer 107 within the opening of the first photoresist.

Once the vias 109 have been formed using the first photoresist and the seed layer 107, the first photoresist may be removed using a suitable removal process. In an embodiment, a plasma ashing process may be used to remove the first photoresist, whereby the temperature of the first photoresist may be increased until the first photoresist experiences a thermal decomposition and may be removed. However, any other suitable process, such as a wet strip, may alternatively be utilized. The removal of the first photoresist may expose the underlying portions of the seed layer 107.

After the removal of the first photoresist exposes the underlying seed layer 107, these portions are removed. In an embodiment the exposed portions of the seed layer 107 (e.g., those portions that are not covered by the vias 109) may be removed by, for example, a wet or dry etching process. For example, in a dry etching process reactants may be directed towards the seed layer 107, using the vias 109 as masks. Alternatively, etchants may be sprayed or otherwise put into contact with the seed layer 107 in order to remove the exposed portions of the seed layer 107. After the exposed portion of the seed layer 107 has been etched away, a portion of the polymer layer 103 is exposed between the vias 109.

After the vias 109 have been formed, the first semiconductor device 111 and the second semiconductor device 113 may be placed on the exposed polymer layer 103. In an embodiment the first semiconductor device 111 and the second semiconductor device 113 are semiconductor devices designed for an intended purpose such as individually being a logic die, a central processing unit (CPU) die, a memory die, combinations of these, or the like. In an embodiment the first semiconductor device 111 and the second semiconductor device 113 comprise integrated circuit devices (not shown), such as transistors, capacitors, inductors, resistors, first metallization layers (not shown), and the like, therein, as desired for a particular functionality. In an embodiment the first semiconductor device 111 and the second semiconductor device 113 are designed and manufactured to work in conjunction with each other and also to work in conjunction with other semiconductor devices (not illustrated in FIG. 1). The first semiconductor device 111 and the second semiconductor device 113 may be attached to the polymer layer 103 using, e.g., an adhesive material, although any suitable method of attachment may alternatively be utilized.

In an embodiment the first semiconductor device 111 comprises a second substrate, first active devices, first metallization layers (not separately illustrated), and second contact pads 123. The second substrate may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The first active devices within the first semiconductor device 111 comprise a wide variety of active devices and passive devices such as capacitors, resistors, inductors and the like that may be used to generate the desired structural and functional desires of the design for the first semiconductor device 111. The first active devices within the first semiconductor device 111 may be formed using any suitable methods either within or else on the second substrate.

The first metallization layers are formed over the second substrate and the first active devices within the first semiconductor device 111 and are designed to connect the various first active devices within the first semiconductor device 111 to form functional circuitry. In an embodiment the first metallization layers are formed of alternating layers of dielectric and conductive material and may be formed through any suitable process (such as deposition, damascene, dual damascene, etc.). In an embodiment there may be four layers of metallization separated from the second substrate by at least one interlayer dielectric layer (ILD), but the precise number of first metallization layers is dependent upon the design of the first semiconductor device 111.

The second contact pads 123 may be formed over and in electrical contact with the first metallization layers. The second contact pads 123 may comprise aluminum, but other materials, such as copper, may alternatively be used. The second contact pads 123 may be formed using a deposition process, such as sputtering, to form a layer of material (not shown) and portions of the layer of material may then be removed through a suitable process (such as photolithographic masking and etching) to form the second contact pads 123. However, any other suitable process may be utilized to form the second contact pads 123. The second contact pads 123 may be formed to have a thickness of between about 0.5 μm and about 4 μm, such as about 1.45 μm.

The second semiconductor device 113 may be similar to the first semiconductor device 111. For example, the second semiconductor device 113 may comprise a third substrate, second active devices, second metallization layers, and third contact pads 125 that are similar to the second substrate, first active devices, first metallization layers, and second contact pads 123, respectively. However, the second semiconductor device 113 may alternatively have different devices and structures than the first semiconductor device 111.

Once the first semiconductor device 111 and the second semiconductor device 113 have been placed between the vias 109, the first semiconductor device 111, the second semiconductor device 113, and the vias 109 may be encapsulated with the first encapsulant 115. The encapsulation may be performed in a molding device (not individually illustrated in FIG. 1). For example, the first semiconductor device 111 and the vias 109 may be placed within a cavity of the molding device, and the cavity may be hermetically sealed. The first encapsulant 115 may be placed within the cavity either before the cavity is hermetically sealed or else may be injected into the cavity through an injection port. In an embodiment the first encapsulant 115 may be a molding compound resin such as polyimide, PPS, PEEK, PES, a heat resistant crystal resin, combinations of these, or the like.

Once the first encapsulant 115 has been placed into the molding cavity such that the first encapsulant 115 encapsulates the carrier substrate 101, the vias 109, the first semiconductor device 111, and the second semiconductor device 113, the first encapsulant 115 may be cured in order to harden the first encapsulant 115 for optimum protection. While the exact curing process is dependent at least in part on the particular material chosen for the first encapsulant 115, in an embodiment in which molding compound is chosen as the first encapsulant 115, the curing could occur through a process such as heating the first encapsulant 115 to between about 100° C. and about 130° C., such as about 125° C. for about 60 sec to about 3000 sec, such as about 600 sec. Additionally, initiators and/or catalysts may be included within the first encapsulant 115 to better control the curing process.

However, as one having ordinary skill in the art will recognize, the curing process described above is merely an exemplary process and is not meant to limit the current embodiments. Other curing processes, such as irradiation or even allowing the first encapsulant 115 to harden at ambient temperature, may alternatively be used. Any suitable curing process may be used, and all such processes are fully intended to be included within the scope of the embodiments discussed herein.

Once the first encapsulant 115 has been placed, the first encapsulant 115 is thinned in order to expose the vias 109, the second contact pads 123 (within the first semiconductor device 111) and the third contact pads 125 (within the second semiconductor device 113) for further processing. The thinning may be performed, e.g., using a mechanical grinding or chemical mechanical polishing (CMP) process whereby chemical etchants and abrasives are utilized to react and grind away the first encapsulant 115 until the vias 109, the second contact pads 123, and the third contact pads 125 have been exposed. As such, the first semiconductor device 111, the second semiconductor device 113, and the vias 109 may have a planar surface that is also planar with the first encapsulant 115.

However, while the CMP process described above is presented as one illustrative embodiment, it is not intended to be limiting to the embodiments. Any other suitable removal process may alternatively be used to thin the first encapsulant 115 and expose the vias 109, the second contact pads 123 and the third contact pads 125. For example, a series of chemical etches may alternatively be utilized. This process and any other suitable process may alternatively be utilized to thin the first encapsulant 115 and expose the vias 109, the second contact pads 123 and the third contact pads 125, and all such processes are fully intended to be included within the scope of the embodiments.

The first interconnection layer 117 is utilized to interconnect the first semiconductor device 111, the second semiconductor device 113, the vias 109 and external devices. In an embodiment the first interconnection layer 117 may be one or more metallization layers or one or more redistribution layers formed over the first semiconductor device 111, the second semiconductor device 113, the vias 109, and the first encapsulant 115. In an embodiment in which the first interconnection layer 117 is one or more metallization layers, the first interconnection layers 117 are formed of alternating layers of dielectric and conductive material and may be formed through any suitable process (such as deposition, damascene, dual damascene, etc.). In an embodiment there may be two layers of metallization, but the precise number of second metallization layers is dependent upon the design of the first package 100.

Alternatively, the first interconnection layer 117 may be one or more redistribution layers. In this embodiment the first interconnection layer 117 is formed by initially forming a seed layer (not separately illustrated) of, e.g., a titanium copper alloy through a suitable formation process such as CVD or sputtering. A second photoresist (also not shown) may then be formed to cover the seed layer, and the second photoresist may then be patterned to expose those portions of the seed layer that are located where the first interconnection layer 117 is desired to be located.

Once the second photoresist has been formed and patterned, a conductive material, such as copper, may be formed on the seed layer through a deposition process such as plating. The conductive material may be formed to have a thickness of between about 1 µm and about 10 µm, such as about 5 µm, and a width of between about 5 µm and about 300 µm, such as about 5 µm. However, while the material and methods discussed are suitable to form the conductive material, these materials are merely exemplary. Any other suitable materials, such as AlCu or Au, and any other suitable processes of formation, such as CVD or PVD followed by a patterning process, may alternatively be used to form the first interconnection layer 117.

Once the conductive material has been formed, the second photoresist may be removed through a suitable removal process such as ashing. Additionally, after the removal of the second photoresist, those portions of the seed layer that were covered by the second photoresist may be removed through, for example, a suitable etch process using the conductive material as a mask.

The conductive material may then be covered by a dielectric material (not separately illustrated in FIG. 1) in order to protect the conductive material. In an embodiment the dielectric material may be silicon oxide or other dielectric material formed through a suitable method such as chemical vapor deposition. Once covered, the process may be repeated in order to form additional redistribution layers for the first interconnection layer 117 until a desired number of layers is reached.

Once the first interconnection layer 117 has been formed, the first contact pads 119 are formed in order to electrically interconnect the first interconnection layer 117 to, e.g., external devices. In an embodiment the first contact pads 119 may be formed over and in electrical contact with the first interconnection layer 117. The first contact pads 119 may comprise aluminum, but other materials, such as copper, may alternatively be used. The first contact pads 119 may be formed using a deposition process, such as sputtering, to form a layer of material (not shown) and portions of the layer of material may then be removed through a suitable process (such as photolithographic masking and etching) to form the first contact pads 119. However, any other suitable process may be utilized to form the first contact pads 119. The first contact pads 119 may be formed to have a thickness of between about 0.5 µm and about 4 µm, such as about 1.45 µm.

In an embodiment some of the first contact pads 119 may be formed to have a fine first pitch $P_1$ for eventual connection to a first link device 201 (not illustrated in FIG. 1 but illustrated and described below with respect to FIG. 2). For example, the first pitch $P_1$ may be between about 20 µm and about 80 µm. However, any suitable pitch may alternatively be utilized.

The first passivation layer 121 may be formed over the first interconnection layer 117 and the first contact pads 119 in order to provide protection and isolation for the first interconnection layer 117 and the other underlying structures. In an embodiment the first passivation layer 121 may be polybenzoxazole (PBO), although any suitable material, such as polyimide or a polyimide derivative, may alternatively be utilized. The first passivation layer 121 may be placed using, e.g., a spin-coating process to a thickness of between about 5 µm and about 25 µm, such as about 7 µm, although any suitable method and thickness may alternatively be used. Once in place, the first contact pads 119 may be exposed through the first passivation layer 121 by removing a portion of the first passivation layer 121 through a process such as photolithographic masking and etching or chemical mechanical polishing (CMP), although any suitable removal process may alternatively be utilized.

Once the first contact pads 119 have been exposed, the UBMs 124 may be formed in contact with the first contact pads 119. In an embodiment the UBMs 124 may comprise three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium tungsten/copper/nickel, or an arrangement of titanium/copper/nickel/gold, that are suitable for the formation of the UBMs 124. Any suitable materials or combination of different layers of material that may be used for the UBMs 124 are fully intended to be included within the scope of the current application.

The UBMs 124 may be created by forming each layer over the first passivation layer 121 and the first contact pads 119. The forming of each layer may be performed using a plating process, such as electrochemical plating, although other processes of formation, such as sputtering, evaporation, or PECVD process, may alternatively be used depending upon the desired materials. The UBMs 124 may be formed to have a thickness of between about 0.7 µm and about 10 µm, such as about 3 µm. Once the desired layers have been formed, portions of the layers may then be removed through a suitable photolithographic masking and etching process to remove the undesired material and to leave the UBMs 124 in a desired shape, such as a circular, octagonal, square, or rectangular shape, although any desired shape may alternatively be formed.

Figure 2:
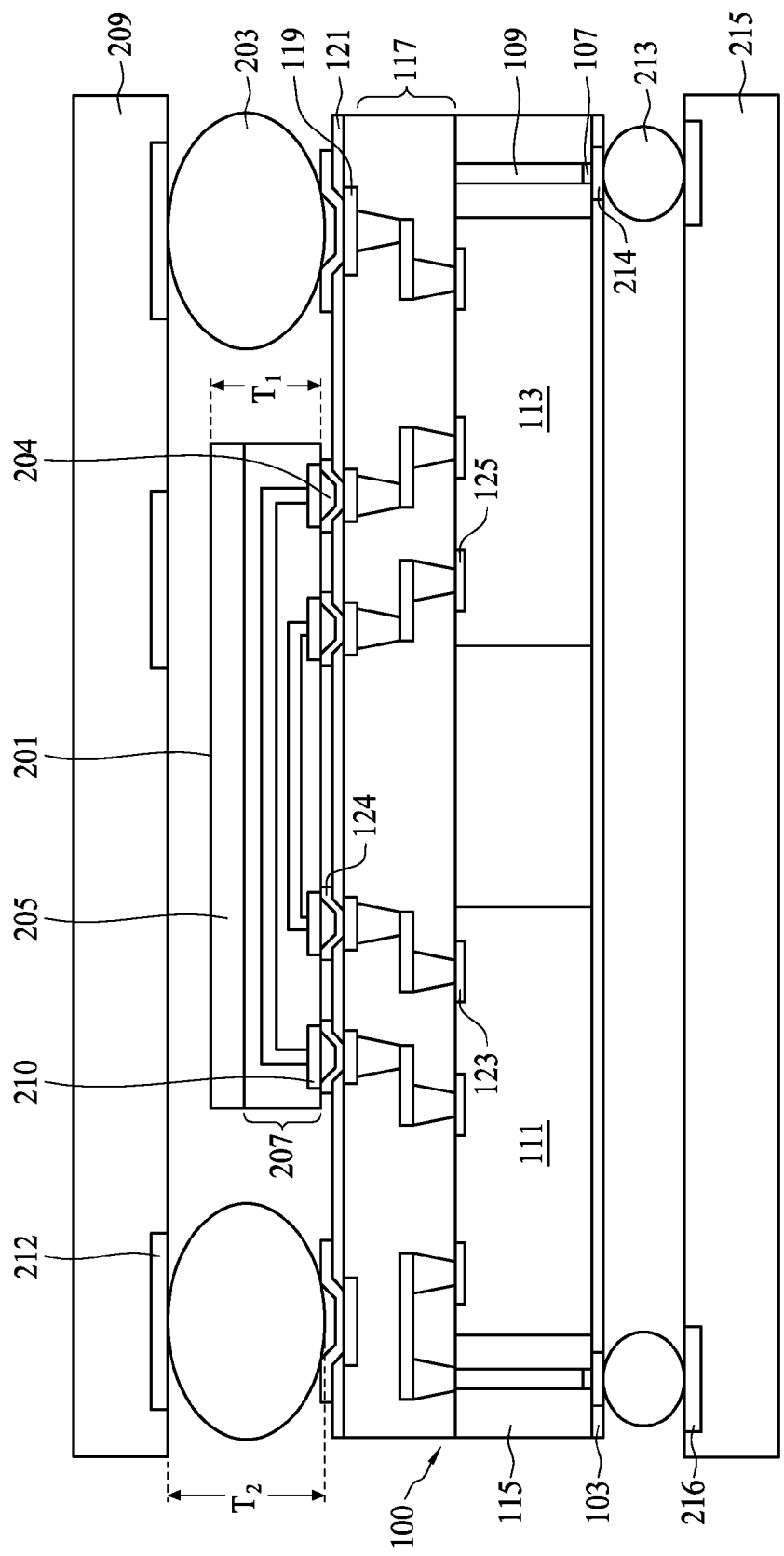
FIG. 2 illustrates a first link device bonded to the integrated fan out package in accordance with some embodiments.

FIG. 2 illustrates a placement of a first link device 201 along with first external connections 203. In an embodiment the first link device 201 is a discrete device that is utilized to provide a high density routing for the first interconnection layer 117, electrically connecting separate ones of the first contact pads 119 in order to provide a desired routing and connectivity between the first semiconductor device 111 and the second semiconductor device 113. In an embodiment the first link device 201 may be a silicon device with a fourth substrate 205, third metallization layers 207, and fourth contact pads 210. The fourth substrate 205 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The third metallization layers 207 are formed over the fourth substrate 205 and are designed to provide a connecting route between different ones of the first contact pads 119. In an embodiment the third metallization layers 207 are formed of alternating layers of dielectric and conductive material and may be formed through any suitable process (such as deposition, damascene, dual damascene, etc.). The precise number of second metallization layers is dependent upon the design of the first link device 201. The third metallization layers 207 may be formed to have a high routing density, such as having a routing density and a narrow connection width/space of about 5000 connections between the first semiconductor device 111 and the second semiconductor device 113 to enable a high connection line application.

Additionally, the first link device 201 may comprise active and passive devices within the first link device 201 in order to provide a desired functionality. In an embodiment the first link device 201 may be an integrated passive device that includes resistors, inductors, and/or capacitors that are connected to each other and to the first contact pads 119 through the third metallization layers 207. However, the first link device 201 is not limited to passive devices, as any suitable device or combination of devices (active or passive) may alternatively be used, and all such combinations are fully intended to be included within the scope of the embodiments.

The sixth contact pads 214 may be formed to provide connectivity between the third metallization layer 207 and, e.g. the first link device connections 204 (described further below). In an embodiment the sixth contact pads 214 may be formed using similar materials and similar processes as the first contact pads 119 (described above with respect to FIG. 1). However, different materials and different processes may alternatively be used.

First link device connections 204 are formed in connection with the UBMs 124 that are intended to be connected to the first link device 201. In an embodiment the first link device connections 204 may be contact bumps such as microbumps, and may comprise a material such as tin, or other suitable materials, such as silver or copper. In an embodiment in which the first link device connections 204 are tin solder bumps, the first link device connections 204 may be formed by initially forming a layer of tin through any suitable method such as evaporation, electroplating, printing, solder transfer, ball placement, etc, to a thickness of about 100 µm. Once a layer of tin has been formed on the structure, a reflow is performed in order to shape the material into the desired bump shapes.

Once formed the first link device 201 may be bonded to the first package 100 by initially aligning the first link device connections 204 with respective ones of, e.g., the sixth contact pads 214, on the first link device 201. Once aligned and in physical contact, a reflow may then be performed in order to reflow the material of the first link device connections 204 and bond the first link device 201 to the first package 100. However, any other suitable bonding method may alternatively be used.

The first external connections 203 are formed in connection with the UBMs 124. The first external connections 203 may be contact bumps such as ball grid array bumps, microbumps, or controlled collapse chip connection (C4) bumps and may comprise a material such as tin, or other suitable materials, such as silver or copper. In an embodiment in which the first external connections 203 are tin solder bumps, the first external connections 203 may be formed by initially forming a layer of tin through any suitable method such as evaporation, electroplating, printing, solder transfer, ball placement, etc, to a thickness of about 100 µm. Once a layer of tin has been formed on the structure, a reflow is performed in order to shape the material into the desired bump shapes.

The first external connections 203 are formed such that the first external connections 203 extend further from the first package 100 than the first link device 201. For example, in an embodiment in which the first link device 201 has a first thickness $T_1$ of about 200 µm, the first external connections 203 have a second thickness $T_2$ that is greater than the first thickness $T_1$, such as about 300 µm. However, any suitable thickness may alternatively be used.

FIG. 2 also illustrates that, once the first external connections 203 have been formed, the first external connections 203 (and the first package 100 in general) can be bonded to a support substrate 209. In an embodiment the support substrate 209 may be a printed circuit board such as a laminate substrate formed as a stack of multiple thin layers (or laminates) of a polymer material such as bismaleimide triazine (BT), FR-4, ABF, or the like. However, any other suitable substrate, such as a silicon interposer, a silicon substrate, organic substrate, a ceramic substrate, or the like, may alternatively be utilized, and all such redistributive substrates that provide support and connectivity to the first package 100 are fully intended to be included within the scope of the embodiments.

The first package 100 may be bonded to the support substrate 209 by initially aligning the first external connections 203 with, e.g., corresponding one of fifth contact pads 212 located on the support substrate 209. Once in physical contact, a reflow may be performed to reflow the first external connections 203 and bond the first external connections 203 with the support substrate 209. However, any other suitable bonding may alternatively be utilized.

FIG. 2 additionally illustrates further processing that can occur on an opposite side of the first package 100 from the support substrate 209 (although the processing may be performed prior to the bonding of the first package 100 to the support substrate 209). In an embodiment the carrier substrate 101 and the adhesive layer 102 are debonded from the remainder of the structure using, e.g., a thermal process to alter the adhesive properties of the adhesive layer 102. In a particular embodiment an energy source such as an ultraviolet (UV) laser, a carbon dioxide ($CO_2$) laser, or an infrared (IR) laser, is utilized to irradiate and heat the adhesive layer 102 until the adhesive layer 102 loses at least some of its adhesive properties. Once performed, the carrier substrate 101 and the adhesive layer 102 may be physically separated and removed from the structure.

Additionally, once the carrier substrate 101 and the adhesive layer 102 have been removed, the polymer layer 103 may be patterned in order to expose the vias 109 and to form sixth contact pads 214. In an embodiment the polymer layer 103 is patterned by initially applying a third photoresist (not individually illustrated in FIG. 2) to the polymer layer 103 and then exposing the third photoresist to a patterned energy source (e.g., a patterned light source) so as to induce a chemical reaction, thereby inducing a physical change in those portions of the third photoresist exposed to the patterned light source. A developer is then applied to the exposed third photoresist to take advantage of the physical changes and selectively remove either the exposed portion of the third photoresist or the unexposed portion of the third photoresist, depending upon the desired pattern, and the underlying exposed portion of the polymer layer 103 are removed with, e.g., a dry etch process. However, any other suitable method for patterning the polymer layer 103 may alternatively be utilized.

Once the vias 109 (including the seed layer 107) have been exposed, the sixth contact pads 214 may be formed in electrical or physical contact with the vias 109 to provide electrical connectivity to the vias 109 through this side of the first package 100. In an embodiment the sixth contact pads 214 may comprise aluminum, but other materials, such as copper, may alternatively be used. The sixth contact pads 214 may be formed using a deposition process, such as sputtering, to form a layer of material (not shown) and portions of the layer of material may then be removed through a suitable process (such as photolithographic masking and etching or chemical mechanical polishing) to form the sixth contact pads 214. However, any other suitable process, such as a damascene process, may be utilized to form the sixth contact pads 214. The sixth contact pads 214 may be formed to have a thickness of between about 0.5 µm and about 4 µm, such as about 1.45 µm.

Once the sixth contact pads 214 have been formed, second external connections 213 may be formed to interconnect the sixth contact pads 214 with a third semiconductor device 215. In an embodiment the third semiconductor device 215 may be any type of semiconductor device design to be used in conjunction with the first semiconductor device 111 and the second semiconductor device 113, such as a memory package or a silicon chip (e.g., a logic die), although any suitable type of devices may be used. Alternatively, the third semiconductor device 215 may be an interposer (with or without active and passive devices) or other suitable connecting structure that provides connectivity and/or functionality to the first package 100.

The second external connections 213 may be formed to interconnect the sixth contact pads 214 with the third semiconductor device 215. The second external connections 213 may be contact bumps such as ball grid array bumps, microbumps, or controlled collapse chip connection (C4) bumps and may comprise a material such as tin, or other suitable materials, such as silver or copper. In an embodiment in which the second external connections 213 are tin solder bumps, the second external connections 213 may be formed by initially forming a layer of tin through any suitable method such as evaporation, electroplating, printing, solder transfer, ball placement, etc, to a thickness of about 100 µm. Once a layer of tin has been formed on the structure, a reflow is performed in order to shape the material into the desired bump shapes.

The first package 100 may be bonded to the third semiconductor device 215 by initially aligning the second external connections 213 with corresponding connections (not individually illustrated in FIG. 2) such as seventh contact pads 216 located on the third semiconductor device 215. Once in physical contact, a reflow may be performed to reflow the second external connections 213 and bond the first package 100 with the third semiconductor device 215. However, any other suitable bonding may alternatively be utilized.

Figure 3:
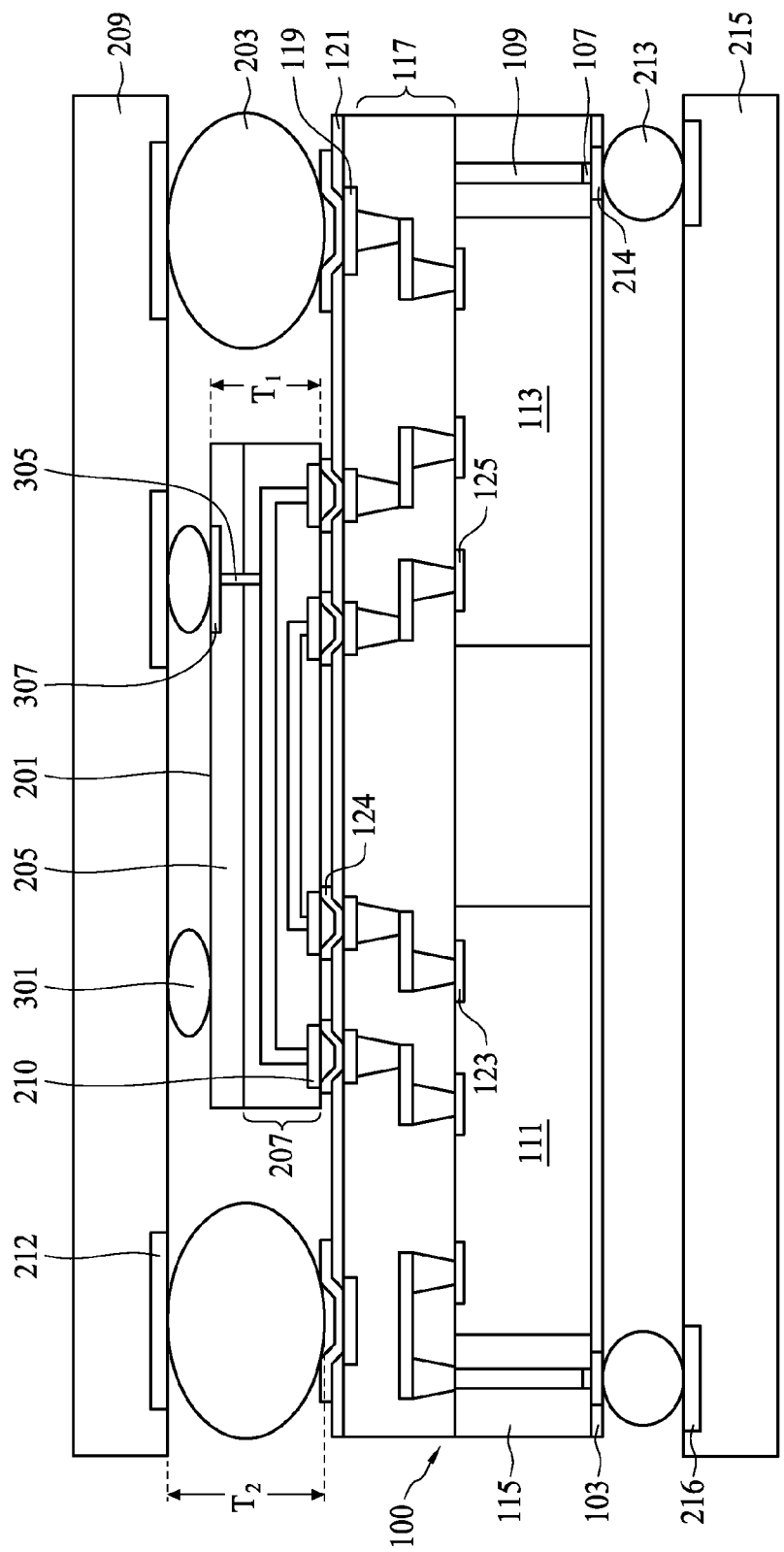
FIG. 3 illustrates an embodiment utilizing support structures in accordance with some embodiments.

FIG. 3 illustrates another embodiment in which support structures 301 may additionally be utilized between the first link device 201 and the support substrate 209. In an embodiment the support structures 301 may be a supporting material such as solder, although any other materials may alternatively be utilized. In an embodiment in which the support structures 301 are solder bumps, the support structures 301 may be contact bumps such as microbumps, ball grid array bumps, or controlled collapse chip connection (C4) bumps and may comprise a material such as tin, or other suitable materials, such as silver or copper. In an embodiment in which the support structures 301 are tin solder bumps, the support structures 301 may be formed by initially forming a layer of tin through any suitable method such as evaporation, electroplating, printing, solder transfer, ball placement, etc., to a thickness suitable to provide support. Once a layer of tin has been formed on the structure, a reflow is performed in order to shape the material into the desired bump shapes.

Once formed, the support structures 301 may be used to provide mechanical support during and after the bonding process that bonds the first package 100 to the support substrate 209. For example, during the bonding process, which may utilize a reflow process, the support structures 301 may be reflowed so that, when the bonding process is finished, the support structures 301 will solidify and provide support between the first package 100 and the support substrate 209. In an embodiment the number of support structures 301 may be between about 1 and about 500, such as about 300, although any suitable number of support structures 301 may be used.

Optionally, in an embodiment in which the support structures 301 are conductive, the support structures 301 may also be utilized to provide a conductive connection between the first link device 201 and the support substrate 209. In such an embodiment a through substrate via 305 may be formed to extend through the fourth substrate 205 and in connection with the third metallization layers 207. Additionally, an eighth contact pad 307 may be formed on a back-side of the fourth substrate 205, to which the support structures 301 may be bonded in order to provide electrical connectivity between the first link device 201 and the support substrate 209.

Figure 4:
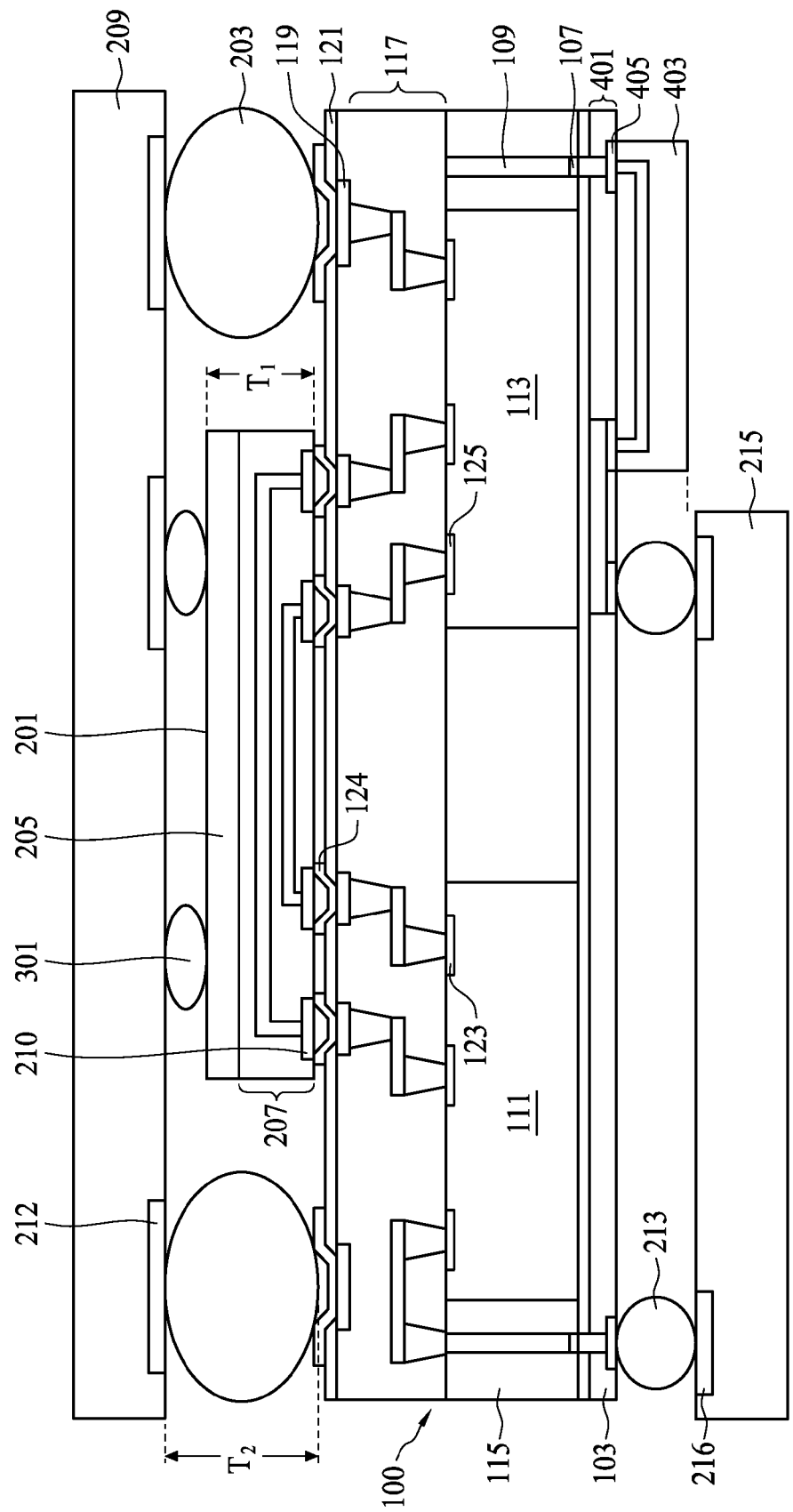
FIG. 4 illustrates a second link device bonded to the integrated fan out package in accordance with some embodiments.

FIG. 4 illustrates yet another embodiment that utilizes a second interconnection layer 401 on an opposite side of the first package 100 than the first link device 201 along with a second link device 403 to interconnect portions of the second interconnection layers 401. In an embodiment the second interconnection layer 401 may be one or more metallization layers or one or more redistribution layers, and may be formed in a similar fashion and from similar materials as the first interconnection layer 117 described above with respect to FIG. 1.

Once the second interconnection layer 401 has been formed, ninth contact pads 405 are formed in order to electrically interconnect the second interconnection layer 401 to, e.g., external devices and separate portions of the second interconnection layer 401. The ninth contact pads 405 may comprise aluminum, but other materials, such as copper, may alternatively be used. The ninth contact pads 405 may be formed using a deposition process, such as sputtering, to form a layer of material (not shown) and portions of the layer of material may then be removed through a suitable process (such as photolithographic masking and etching or chemical mechanical polishing) to form the ninth contact pads 405. However, any other suitable process may be utilized to form the ninth contact pads 405. The ninth contact pads 405 may be formed to have a thickness of between about 0.5 μm and about 4 μm, such as about 1.45 μm.

However, in this embodiment, the second link device 403 is utilized to interconnect separate ones of the ninth contact pads 405. The second link device 403 may be similar to the first link device 201 (described above with respect to FIG. 2). For example, the second link device 403 may be a discrete silicon device with a substrate and metallization layers, and may optionally include passive and/or active devices. However, the second link device 403 may alternatively be different from the first link device 201.

Additionally, the second link device 403 may have a thickness that is less than the offset of the third semiconductor device 215. As such, the second link device 403 may be located either between the third semiconductor device 215 and the second interconnection layer 401 or else may be located as being laterally removed from the third semiconductor device 215. However, any suitable thickness and arrangements of the second link device 403 and the third semiconductor device 215 may alternatively be utilized.

Alternatively, instead of forming the second interconnection layer 401 after the carrier substrate 101 and the adhesive layer 102 have been debonded, the second interconnection layer 401 may be formed prior to the placement of the first semiconductor device 111 and the second semiconductor device 113. For example, the second interconnection layer 401 may be formed after the placement of the polymer layer 103. Once the second interconnection layer 401 has been formed, an adhesive layer, such as tape, may be placed over the second interconnection layer 401, and the first semiconductor device 111 and the second semiconductor device 113 may be adhered to the adhesive layer. Once adhered, the first semiconductor device 111, the second semiconductor device 113, and the second interconnection layer 401 may be encapsulated as described above with respect to FIG. 1.

After encapsulation, the carrier substrate 101 and the adhesion layer 102 may be removed, and the ninth contact pads 405 may be formed in electrical connection to the second interconnection layer 401. Once the ninth contact pads 405 have been formed the second link device 403 and the third semiconductor device 215 are bonded to the first package 100.

In an embodiment the second link device 403 may be physically integrated with the third semiconductor device 215 on the same side of the first package 100. For example, the second link device 403 may be placed between the third semiconductor device 215 and the first package 100, or, as illustrated in FIG. 4, the second link device 403 may be offset from the third semiconductor device 215. Any suitable arrangement of the second link device 403 and the third semiconductor device 215 may be utilized.

Figure 5:
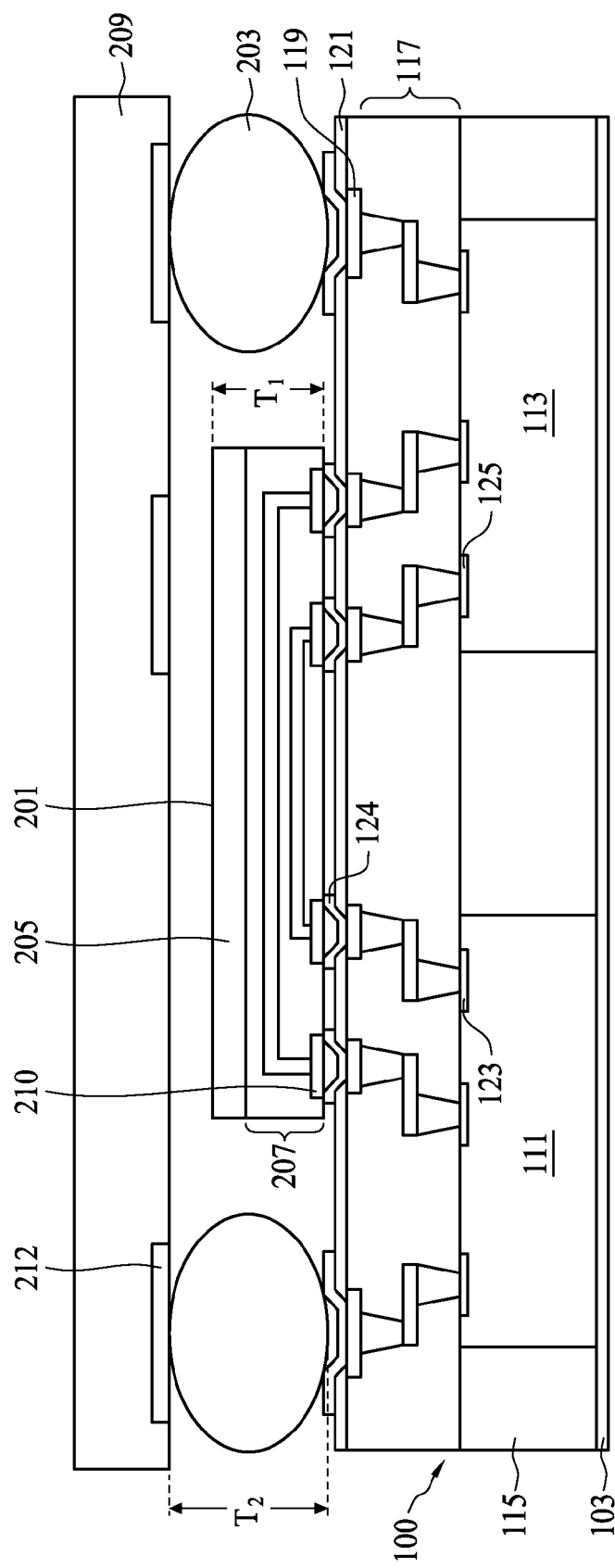
FIG. 5 illustrates an embodiment without through package vias in accordance with some embodiments.

FIG. 5 illustrates yet another embodiment in which the vias 109 are not formed within the first package 100. In this embodiment the first semiconductor device 111 and the second semiconductor device 113 are encapsulated, the first interconnection layer 117 and the first contact pads 119 are formed, and the first link device 201 is bonded to the first package 100. Additionally, the first external connections 203 are formed, and the support substrate 209 is bonded to the first external connections 203. However, the vias 109 are not formed, so there is no connectivity through the first encapsulant 115 to the opposite side of the first package 100, although there may be some connectivity through the first semiconductor device 111 or the second semiconductor device 113 (not separately illustrated in FIG. 5).

Figure 6:
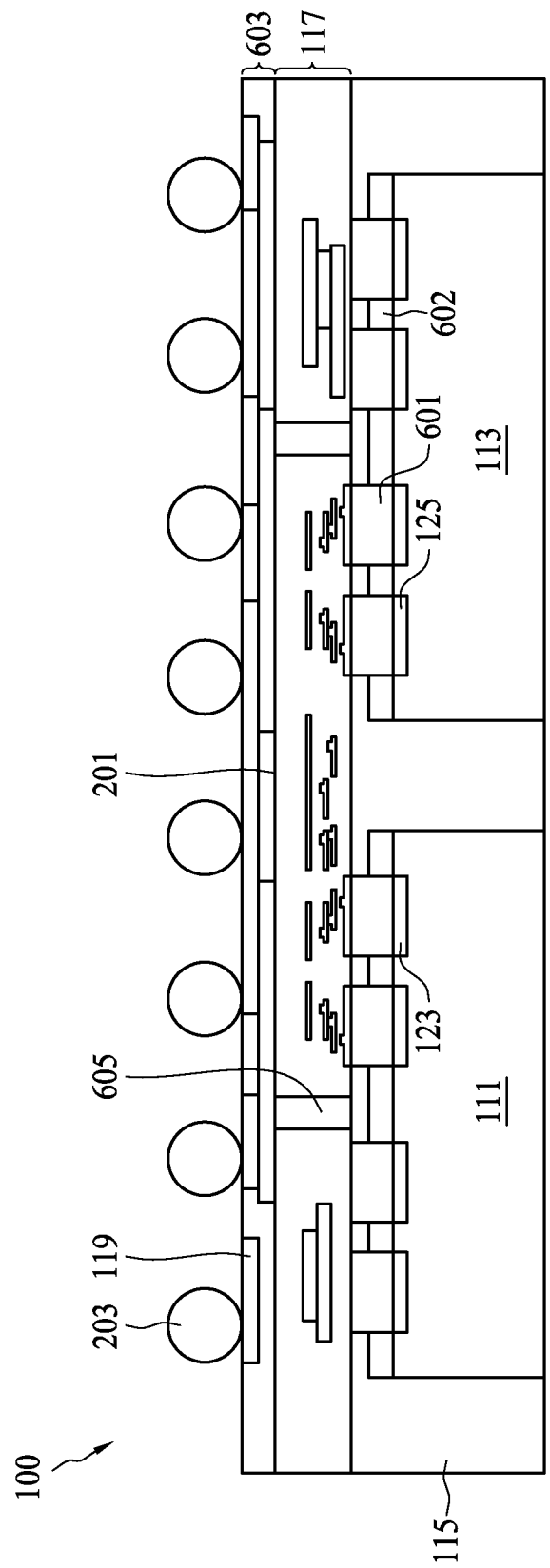
FIG. 6 illustrates a first link device being embedded within a first interconnect layer in accordance with some embodiments.

FIG. 6 illustrates yet another embodiment in which the first link device 201 is attached directly to the first semiconductor device 111 and the second semiconductor device 113, with the first link device 201 being embedded within the first interconnect layer 117. In this embodiment, conductive pillars 601 are formed on the second contact pads 123 and the third contact pads 125. This formation may be performed either prior to the placement of the first semiconductor device 111 and the second semiconductor device 113 (in which case the formation is performed separately on the first semiconductor device 111 and the second semiconductor device 113) or after the placement of the first semiconductor device 111 and the second semiconductor device 113 (in which case the formation is performed simultaneously on the first semiconductor device 111 and the second semiconductor device 113).

In an embodiment the formation of the conductive pillars 601 may be initiated by depositing a passivation layer 602 over the second contact pads 123 and the third contact pads 125. In an embodiment the passivation layer 602 may be formed from a polymer such as polyimide, or may alternatively be formed of materials such as silicon oxides, silicon nitrides, low-k dielectrics, extremely low-k dielectrics, combinations of these, and the like. The passivation layer 602 may be formed to have a thickness of between about 2 µm and about 15 µm, such as about 5 µm.

The conductive pillars 601 may be formed by initially forming a fourth photoresist (not shown) over the passivation layer 602 to a thickness greater than about 20 µm, or even greater than about 60 µm. The fourth photoresist may be patterned to expose portions of the passivation layer 602 through which the conductive pillars 601 will extend. Once patterned, the fourth photoresist may then be used as a mask to remove the desired portions of the passivation layer 602, thereby exposing those portions of the underlying second contact pads 123 and the third contact pads 125 to which the conductive pillars 601 will make contact.

After the passivation layer 602 has been patterned, the conductive pillars 601 may be formed within the openings of both the passivation layer 602 as well as the fourth photoresist. The conductive pillars 601 may be formed from, e.g., a conductive material such as copper. Additionally, the conductive pillars 601 may be formed using a process such as electroplating, by which an electric current is run through the second contact pads 123 and the third contact pads 125 to which the conductive pillars 601 are desired to be formed, and the second contact pads 123 and the third contact pads 125 are immersed in a solution. The solution and the electric current deposit the conductive material, e.g., copper, within the openings in order to fill and/or overfill the openings of the fourth photoresist and the passivation layer 602, thereby forming the conductive pillars 601. Excess conductive material outside of the opening may then be removed using, for example, a chemical mechanical polish (CMP).

After the conductive pillars 601 have been formed, the fourth photoresist may be removed through a process such as ashing, whereby the temperature of the fourth photoresist is increased until the fourth photoresist decomposes and may be removed. After the removal of the fourth photoresist, the conductive pillars 601 may extend away from the passivation layer 602.

However, as one of ordinary skill in the art will recognize, the above described process to form the conductive pillars 601 is merely one such description, and is not meant to limit the embodiments to this process. Rather, the described process is intended to be merely illustrative, as any suitable process for forming the conductive pillars 601 may alternatively be utilized. For example, forming the passivation layer 602 to a thickness greater than its eventual thickness, forming the conductive pillars 601 into an opening of the passivation layer 602, and then removing a top portion of the passivation layer 602 such that the conductive pillars 601 extends away from the passivation layer 602, may also be utilized. All suitable processes for forming the conductive pillars 601 are fully intended to be included within the scope of the present embodiments.

Once the conductive pillars 601 have been formed on the first semiconductor device 111 and the second semiconductor device 113, the first semiconductor device 111 and the second semiconductor device 113 may be encapsulated as described above with respect to FIG. 1. However, in this embodiment, the thinning of the encapsulant using, e.g., the CMP process described in FIG. 1, exposes the conductive pillars 601.

Once the first semiconductor device 111 and the second semiconductor device 113 have been encapsulated, the first interconnect layer 117 is formed over the first semiconductor device 111 and the second semiconductor device 113. In an embodiment the first interconnect layer 117 may be formed as described above with respect to FIG. 1 in order to interconnect the conductive pillars 601. However, in this embodiment, a first region of the first interconnect layer 117 where the first link device 201 is intended to be placed is left free from devices and interconnects that are desired in the final product.

Once the first interconnect layer 117 has been formed, the first region of the first interconnect layer 117 is removed. In an embodiment the removal may be performed using, e.g., a photolithographic masking and etching process, whereby a fifth photoresist is deposited, illuminated, and developed, and the resulting mask is utilized in an dry etching process to remove exposed portions of the underlying first interconnect layer 117. The removal process is continued until respective ones of the conductive pillars 601 (those intended to be connected to the first link device 201) have been exposed through the first interconnect layer 117.

Once exposed, the first link device 201 may be placed into the first region in electrical and physical contact with the respective ones of the conductive pillars 601 exposed by the removal process. In an embodiment the first link device 201 may be bonded to the conductive pillars 601 (and, hence, to the first semiconductor device 111 and the second semiconductor device 113) using, e.g., a thermo-compression bonding process, although any suitable process may alternatively be utilized.

Once the first link device 201 has been bonded to the conductive pillars 601, a second encapsulation process may be utilized to encapsulate the first link device 201 with the first interconnect layer 117 in a second encapsulant 605. In an embodiment the second encapsulation process is similar to the first encapsulation process (described above with respect to FIG. 1). For example, the first link device 201 and the first package 100 are placed into a molding chamber (not individually illustrated) and the second encapsulant 605 is injected or otherwise placed into the molding chamber to encapsulate the first link device 201 and the first interconnect layer 117. Once encapsulated, the second encapsulant 605 is cured and then thinned using, e.g., a chemical mechanical polishing process in order to expose the first link device 201 and the first interconnect layer 117.

Once the first interconnect layer 117 and the first link device 201 have been bonded, a third interconnect layer 603 may be formed over the first interconnect layer 117 and the first link device 201. In an embodiment the third interconnect layer 603 may be formed to connect the first interconnect layer 117 with, e.g., the first contact pads 119, and may be formed using similar processes as the first interconnect layer 117 (described above with respect to FIG. 1). However, the third interconnect layer 603 may be formed through any suitable process.

Once the third interconnect layer 603 has been formed, the first contact pads 119, the UBMs 124 (not separately illustrated in FIG. 6), and the first external connections 203 may be formed in electrical connection with the third interconnect layer 603 in order to provide electrical connectivity between the third interconnect layer 603 and, e.g., the support substrate 209 (not illustrated in FIG. 6). However, any suitable type of external connections may alternatively be formed.

By utilizing the link devices described herein, the normal limitations of redistribution layer line width and space limitations (wherein the RDL width/space is 2 µm/2 µm, and limited to 1 µm/1 µm for a die-to-die connection capability of 120 line/mm) may be avoided. Additionally, by using semiconductor processing methods to form the first link device 201 and the second link device 403, existing silicon fabrication technology and capabilities may be leveraged without a large investment for additional tools. Such connections may achieve a high routing density (similar to a chip on wafer on substrate (CoWoS) and silicon bridges and higher than a integrated fan out package without the first link device 201 or the second link device 403), a high power delivery quality (similar to the CoWoS and the integrated fan out package without the first link device 201 or the second link device 403 and higher than the silicon bridge), at a cost that is similar to a silicon bridge and less than the CoWoS, although still greater than the integrated fan out package without the first link device 201 or the second link device 403.

In accordance with an embodiment, a device comprising a first semiconductor die and a second semiconductor die is provided. An encapsulant encapsulates the first semiconductor die and the second semiconductor die, and a first link device electrically connecting the first semiconductor die and the second semiconductor die, wherein the first link device extends over the first semiconductor die, the second semiconductor die, and the encapsulant.

In accordance with another embodiment, a device comprising a first link device and a first semiconductor die electrically connected to the first link device is provided. A second semiconductor die is electrically connected to the first link device, wherein the first link device electrically connects the first semiconductor die to the second semiconductor die, and wherein the second semiconductor die is laterally separated from the first semiconductor die. An encapsulant encapsulates the first semiconductor die and the second semiconductor die.

In accordance with yet another embodiment, a method of manufacturing a semiconductor device comprising encapsulating a first semiconductor die and a second semiconductor die with an encapsulant is provided. A first linking device is placed over the first semiconductor die, the second semiconductor die, and at least a portion of the encapsulant, wherein the linking device is electrically connected to both the first semiconductor die and the second semiconductor die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:
   a first semiconductor die and a second semiconductor die;
   an encapsulant encapsulating the first semiconductor die and the second semiconductor die;
   a first link device electrically connecting the first semiconductor die and the second semiconductor die, wherein the first link device extends over the first semiconductor die, the second semiconductor die, and the encapsulant;
   an interconnection layer located on an opposite side of the encapsulant than the first link device; and
   a second link device electrically connecting a first portion of the interconnection layer with a second portion of the interconnection layer.

2. The device of claim 1, further comprising a through via extending through the encapsulant and laterally removed from the first semiconductor die and the second semiconductor die.

3. The device of claim 1, wherein the interconnection layer extends over the first semiconductor, the second semiconductor die, and the encapsulant, wherein the interconnection layer electrically connects the first link device with the first semiconductor die and the second semiconductor die.

4. The device of claim 3, further comprising:
   a first electrical connection laterally removed from the first link device and in electrical connection with the interconnection layer, wherein the first electrical connection extends further away from the interconnection layer than the first link device; and
   a support substrate bonded to the first electrical connection.

5. The device of claim 4, further comprising supports between the first link device and the support substrate.

6. The device of claim 5, wherein the supports electrically connect the first link device and the support substrate.

7. The device of claim 1, further comprising a third semiconductor device bonded to the interconnection layer.

8. A device comprising:
   a first link device;
   a first semiconductor die electrically connected to the first link device;
   a second semiconductor die electrically connected to the first link device, wherein the first link device electrically connects the first semiconductor die to the second semiconductor die, and wherein the second semiconductor die is laterally separated from the first semiconductor die;
   an encapsulant encapsulating the first semiconductor die and the second semiconductor die;
   an external connection bonded to the interconnection layer, wherein the external connection has a thickness that is larger than the first link device; and
   a substrate located over the first link device and bonded to the external connection.

9. The device of claim 8, further comprising a through via extending through the encapsulant and being separated from the first semiconductor die and the second semiconductor die.

10. The device of claim 9, further comprising an interconnection layer between the first link device and the first semiconductor die, wherein the interconnection layer electrically interconnects the first link device with the first semiconductor die and the second semiconductor die.

11. The device of claim 8, further comprising a support structure extending between the first link device and the substrate.

12. The device of claim 11, wherein the support structure connects the first link device to the substrate both physically and electrically.

13. The device of claim 8, wherein the first link device is an integrated passive device.

14. The device of claim 8, wherein the first link device is embedded within an interconnection layer.

15. A method of manufacturing a semiconductor device, the method comprising:

encapsulating a first semiconductor die and a second semiconductor die with an encapsulant;

placing a first linking device over the first semiconductor die, the second semiconductor die, and at least a portion of the encapsulant, wherein the linking device is electrically connected to both the first semiconductor die and the second semiconductor die; and bonding the interconnection layer to a support substrate with external connections, wherein the support substrate is located on an opposite side of the linking device than the interconnection layer.

16. The method of claim 15, wherein the encapsulating the first semiconductor die and the second semiconductor die further comprises encapsulating a through via.

17. The method of claim 16, further comprising forming an interconnection layer over the first semiconductor die, the second semiconductor die, the through via, and the encapsulant, wherein the interconnection layer electrically interconnects the linking device with the first semiconductor die and the second semiconductor die.

18. The method of claim 15, further comprising placing support structures between the linking device and the support substrate.

19. The method of claim 18, further comprising bonding the support structures to a contact pad of the linking device.

20. The method of claim 15, further comprising;

forming a metallization layer on an opposite side of the encapsulant than the interconnection layer; and linking a first portion of the metallization layer with a second portion of the metallization layer through a second linking device.

* * * * *